United States Patent [19]

Feeney et al.

[11] Patent Number: 5,687,188
[45] Date of Patent: Nov. 11, 1997

[54] METHOD OF PRODUCING AN ADJUSTED METRIC

[75] Inventors: Gregory A. Feeney, Palatine; Alan L. Wilson, Hoffman Estates, both of Ill.

[73] Assignee: Motorola, Inc., Schaumburg, Ill.

[21] Appl. No.: 320,714

[22] Filed: Oct. 11, 1994

[51] Int. Cl.[6] .................... H04B 1/38; H04L 5/16
[52] U.S. Cl. .................... 375/220; 375/262; 375/265; 375/341; 371/36; 455/33.1; 455/56.1; 455/67.1; 455/226.2
[58] Field of Search .................... 375/262, 265, 375/341, 220; 371/43, 36; 455/33.1, 33.2, 54.1, 56.1, 67.1, 226.1, 226.2

[56] References Cited

U.S. PATENT DOCUMENTS

| | | | |
|---|---|---|---|
| 4,780,883 | 10/1988 | O'Connor et al. | 375/219 |
| 4,932,029 | 6/1990 | Heichler | 371/43 |
| 5,007,047 | 4/1991 | Sridhar et al. | 375/222 |
| 5,297,169 | 3/1994 | Backstrom et al. | 455/33.1 |
| 5,309,503 | 5/1994 | Bruckert et al. | 455/33.4 |
| 5,509,031 | 4/1996 | Johnson et al. | 375/262 |

Primary Examiner—Stephen Chin
Assistant Examiner—Don Vo
Attorney, Agent, or Firm—Susan L. Lukasik

[57] ABSTRACT

A method voting multiple messages begins with a communication unit (111) transmitting (301) a message. At each of a plurality of sites, the message is received (303) and decoded (305) such that a minimized metric is computed and decoded message is extracted from the message. The minimized metric is adjusted (307), producing an adjusted metric. Each of the plurality of sites transports (309) its decoded message and its adjusted metric to a comparator. The comparator receives (311) selecting the decoded message and the adjusted metric from each of the plurality of sites, compares (313) selecting the adjusted metric from each of the plurality of sites and finds an optimal adjusted metric. The decoded message associated with the optimal adjusted metric is then selected (315).

23 Claims, 3 Drawing Sheets

METHOD OF PRODUCING AN ADJUSTED METRIC

FIELD OF THE INVENTION

This invention relates to digital communication systems, including but not limited to voting methods for digital communication systems.

BACKGROUND OF THE INVENTION

Radio frequency (RF) communication systems often employ multiple fixed end receivers operating on the same frequency in generally the same geographic area to improve the performance of the receiving radio signals due to low power or interference. In such a system it is necessary to distinguish or vote on which of the multiple fixed end receivers has recovered the best signal or to compose a best possible signal using a comparison of the signals from each of the multiple fixed end receivers. Current implementations of voting systems are found for analog voice in a SPEC-TRATAC™ system, SECURENETS™ 12 kbps digital voice in a DIGITAC™ system, ASTRO™ digital voice in an ASTRO™ comparator system, and digital data in RDLAP™ systems, where each of these systems is available from Motorola, Inc. Comparators, also known as voters, are also commonly known to provide voting functionality in communication systems.

In analog voice systems the signal-to-noise ratio of the incoming signal is measured and is used to vote the best signal. This measurement process is achieved by sending a reference signal from each receiver to the comparator. When a receiver unsquelches for an incoming voice signal, the comparator compares the received voice signal plus noise to the reference signal for each receiver to get a measure of the signal plus noise. The inbound receiver with the lowest value of signal plus noise should have the most favorable signal-to-noise ratio. The inbound receiver with the best associated signal-to-noise ratio is then voted. This analog voice method will not work well in the digital data system because, in general, analog comparator methods simply are not compatible with digital message systems.

Digital decoding methods are well known in the art. Hard decoding methods employ slicing the received discriminator samples into quantized values. Any forward error correction is then performed on the recovered quantized values using methods such as Golay, Reed-Solomon, or Hamming codes, as are well known in the art. This method allows the number of values corrected to be counted and thus determines the total errors found in the received signal.

With soft decision methods of digital decoding, the received signal is sampled once for each symbol that is received. Instead of quantizing the samples as is performed in hard decoding methods, the samples are decoded for the trellis code using a Viterbi Algorithm. Soft decision methods allows error correction methods such as a Viterbi Algorithm to take advantage of the amplitude and phase information of the received signal in the recovery and error correction of the message. Soft decision methods are usually more effective than hard decoding methods, as is well known in the art.

In SECURENET® 12 kbps digital voice systems, a random bit comparison method as well as a majority vote method are used to determine the best signal. In a system with three or more receivers, a majority vote is performed. The comparator aligns the bit streams of all the receivers to be voted. Then the aligned bit values of each receiver are voted and the majority value for each bit is chosen. For a system with two receivers, the comparator groups the bits together in threes. The comparator then counts the occurrences of each of the eight possible group patterns. A signal with a low level of errors should have a fairly even distribution of bit patterns among the eight different types of groups. A signal with a distribution that tends to weigh more toward a specific pattern is more likely to have errors. The signal with the most even distribution of bit patterns is voted. A similar method to SECURENET® 12 kbps digital voice could not be used in a digital data system because hard decoding methods work on a bit-by-bit basis, whereas soft decision methods used in digital data systems require processing to be done on a block of data.

In ASTRO™ digital voice systems or, more generally, systems using error correction capability with a hard decoding method, a bit error rate determination is employed to find the best of multiple received signals. When the signal is decoded in the receiver, an error quantity is computed indicating the number of bit errors corrected during the decoding process. This bit error information is then sent to the comparator along with the voice signal. The signal with the lowest associated error quantity is the best signal. The comparator chooses the voice signal with the lowest error quantity. The method used in ASTRO™ digital voice systems, however, is unusable with digital data systems. Unlike digital voice, which uses a hard decoding method, digital data soft decision decoding methods give no indication of the number of bit errors that were corrected during the decoding process. Consequently, there is no way to report bit errors to the comparator from the message recovery process.

Most methods of transmitting data take the entire data message and segment the message into smaller data packets. A data packet is encoded with a trellis code to improve its resistance to noise and interference when it is transmitted on a radio channel. A data packet is also split into smaller blocks to allow individual blocks to be selectively retransmitted in the event that the trellis code on any given block is unable to resist the noise or interference. In this case, the trellis code is overcome by the noise resulting in one or more errors in the block of information. Each block of information also provides natural boundaries for a trellis encoder to begin and end the encoding procedure. Block segmentation also allows the transmitter to shuffle or interleave the block's contents in order to resist burst errors as commonly occur during fades on the channel. Trellis codes are used extensively in packet data systems.

For RDLAP™ digital data systems employing trellis coded modulation with a soft decision method, a CRC check over the recovered signal is employed for voting. The receiver sends the recovered signal and a measure of the inbound signal strength to the comparator. The comparator checks the CRCs of all the incoming signals. The first signal with a correct CRC is chosen. Any incoming signals with duplicate CRC values are discarded as duplicate copies. The inbound signal strength measure is used for site steering only. Site steering allows the comparator to locate which site the transmitting unit was closest to when it sent the signal so that any acknowledgments or retransmission requests may be sent from that site. The method used by RDLAP™ digital data systems might be employed in other digital data systems, but a disadvantage of this method is that the comparator must wait for the entire message to be received before verifying the CRC and routing the message. This waiting period adds delay to the overall message throughput.

For digital data systems employing trellis coded modulation with a soft decision method, the previously described methods of choosing a best signal from multiple fixed end receivers do not work well. Accordingly, there is a need for a faster, more convenient way to choose the best signal independent of the system size.

DESCRIPTION OF A PREFERRED EMBODIMENT

The following describes an apparatus for and method of adjusting a minimized metric that is output from a trellis decoder in a receiver. The adjusted metric is a compressed form of the minimized metric and compensates for distortion in the receiver. The adjusted metric, or the minimized metric, is then used by a comparator to vote multiple messages.

An apparatus comprising a receiver receives a message. A trellis decoder is operably coupled to the receiver and is constructed and arranged to output decoded information from the message and a minimized metric based on the decoded information. An adjuster is operably coupled to the trellis decoder and constructed and arranged to provide an adjusted metric that compensates for receiver distortion on strong signals and efficiently indicates signal quality of the message. In addition, the adjuster is constructed and arranged to compress a 24-bit metric into an 8-bit metric. The adjuster may further be constructed and arranged to compare the minimized metric to a first and a second range of values and when the minimized metric falls within the first range of values, the adjusted metric is the result of $214,636 (MM)^{3.5} - 0.9$, where MM is the minimized metric. The adjuster may also be constructed and arranged to compare the minimized metric to a first and a second range of values and when the minimized metric falls within the second range of values, the adjusted metric is the result of $-38.8 (ln(-2.76 MM+1.26))+166$, where MM is the minimized metric.

Figure 1:
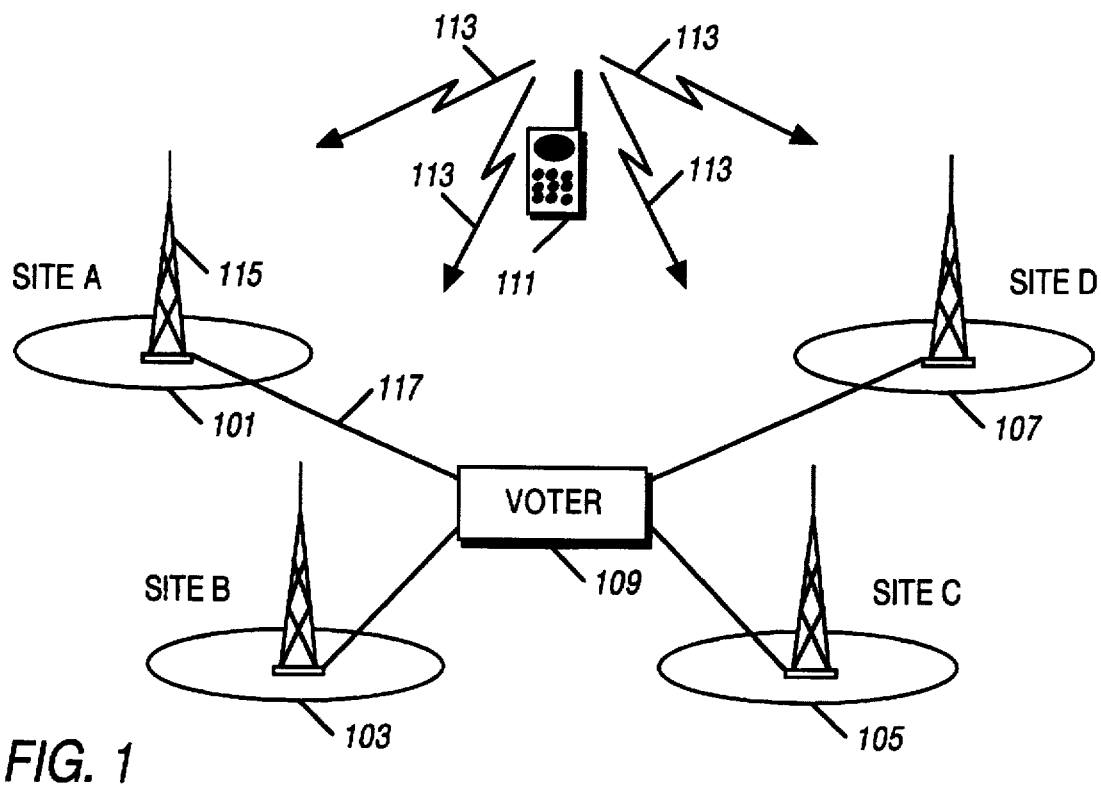
FIG. 1 is a block diagram of a communication system including a voter in accordance with the invention.

FIG. 1 shows a communication system in which a voter is used to select one of many signals from multiple communication sites. The present invention is embodied in a communication system such as the system shown in FIG. 1. The communication system includes a plurality of communication sites 101, 103, 105, and 107. Each of these sites 101, 103, 105, and 107 contains one or more base stations 115, such as a QUANTAR® Base Station available from Motorola, Inc. A voter 109 is connected to each of the base stations 115 via wireline 117 or other communications media. The voter may be an ASTROTAC® Comparator, available from Motorola, Inc. Voters are also commonly known as comparators in the art, and the term "voter"0 and "comparator" will be used interchangeably throughout this specification. In a typical voting system, a communication unit 111 transmits a message that may be received at one or more of the plurality of communication sites 101, 103, 105, and 107 by the base stations 115. Each of these sites 101, 103, 105, and 107, receives the message and forwards it to the voter 109 with any other pertinent information. The voter 109 then selects one of these messages for either retransmission throughout the communication system, forwarding to a dispatch center, forwarding to a data controller or gateway, forwarding to a computer aided dispatch controller, forwarding to a Key Management Controller, or perhaps even back to the plurality of communication sites 101, 103, 105, and 107 for transmission over the RF communication resource from the base stations 115 to other communication units 111, as are known in the art. Although only four sites are shown in FIG. 1, the present application may be applied with equal success in a system employing two or more sites.

Figure 2:
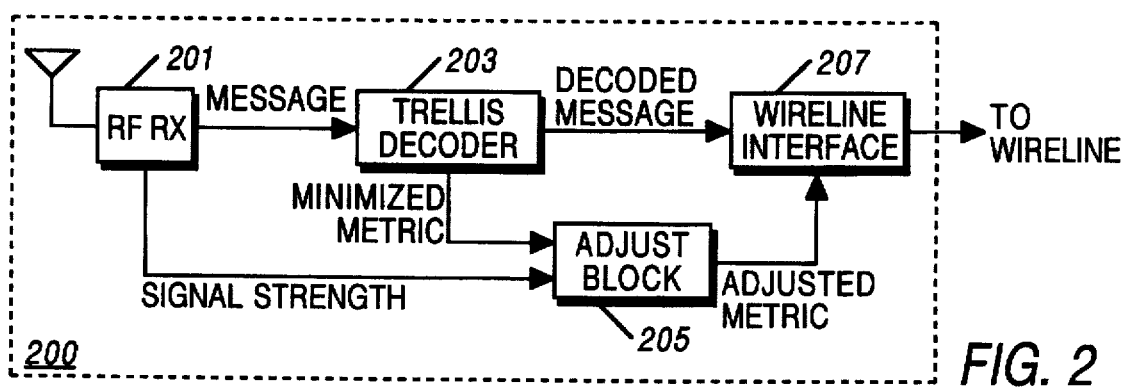
FIG. 2 is a block diagram of a base station receiver in accordance with the invention.

A block diagram of a base station receiver is shown in FIG. 2. A message from a communication unit 111 is transmitted via an RF communication resource and is received by the RF receiver 201 of the base station receiver 200. The RF receiver 201 performs the functions of conversion of the incoming signal to baseband and intermediate frequencies, as is well known in the art; In-phase (I) and Quadrature (Q) sample recovery; intermediate frequency filtering of the I and Q samples; discrimination of the I and Q samples; and calculation of the received signal strength of the incoming message. The result is a message that is sent to a trellis decoder 203. All of these elements of a base station receiver can be implemented using a DSP56002, available from Motorola, Inc. or any of the various digital signal processors available.

In the preferred embodiment, the trellis decoder 203 applies the Viterbi Algorithm to the received message in order to decode the received message into a decoded message. The Viterbi Algorithm is well known in the art and is described in *Introduction to Trellis-Coded Modulation with Applications*, by Ezio Biglieri, Dariush Divsalar, Peter McLane, and Marvin Simon, published by Macmillan in 1991, as well as numerous other references. The trellis decoder 203 outputs a decoded message to a wireline interface (IF) block 207. The trellis decoder 203 also outputs a minimized metric to an adjust block 205. The minimized metric is also referred to as a minimum path metric or a surviving metric in the art.

The minimized metric is obtained by the process described by Biglieri et al. The trellis code uses a sequence of states and branches, and the receiver searches through all of the possible branches from each state to determine the branch with the lowest surviving metric value. The metric value is chosen to closely match the probability of error (in this case the probability that the wrong branch is chosen) for the communication system's trellis coded modulation. Biglieri refers to this as the branch metric, and this will be simplified to "the metric." The Viterbi Algorithm tests each branch from each current state to each succeeding state, and chooses the branch with the minimum metric value for each succeeding state. Consequently, the Viterbi Algorithm results at the end of the process with a set of final states, a set of surviving minimized metrics for each final state, and a set of branch paths through the trellis for each final state. The trellis decoder 203 in this preferred embodiment knows the final state for the trellis code because the trellis encoder in the communication unit 111 transmitter terminates each block of data with enough pad values to end at a predetermined state, which in this case is the all-zero state. Consequently, the trellis decoder selects this predetermined final state at the end of each block and uses the minimized metric for this state as the minimized metric shown in FIG. 2. The decoder then reverses the path through the trellis to determine the data that was transmitted for each state in the path to the final state with this minimized metric value.

The adjust block 205 adjusts the metric and forwards an adjusted metric to the wireline interface block 207. The adjust block 205 performs the steps of the flowchart of FIG. 4 to determine the adjusted metric.

The wireline interface block 207 takes each block of the decoded message together with the adjusted metric and formats them into small packets which will be referred to as mini-packets, in order to distinguish them from the data packets that are sent by the communication unit 111. Each data packet from the communication unit 111 may be sent with one or more mini-packets through the wireline interface 207. The mini-packet includes one or more blocks of the data message and the adjusted metric value for each block. The mini-packet is sent through the wireline as an HDLC (High-level Data Link Control) packet, as is well known in the art. These mini packets are then forwarded via wireline 117 or other medium to the voter 109.

Figure 3:
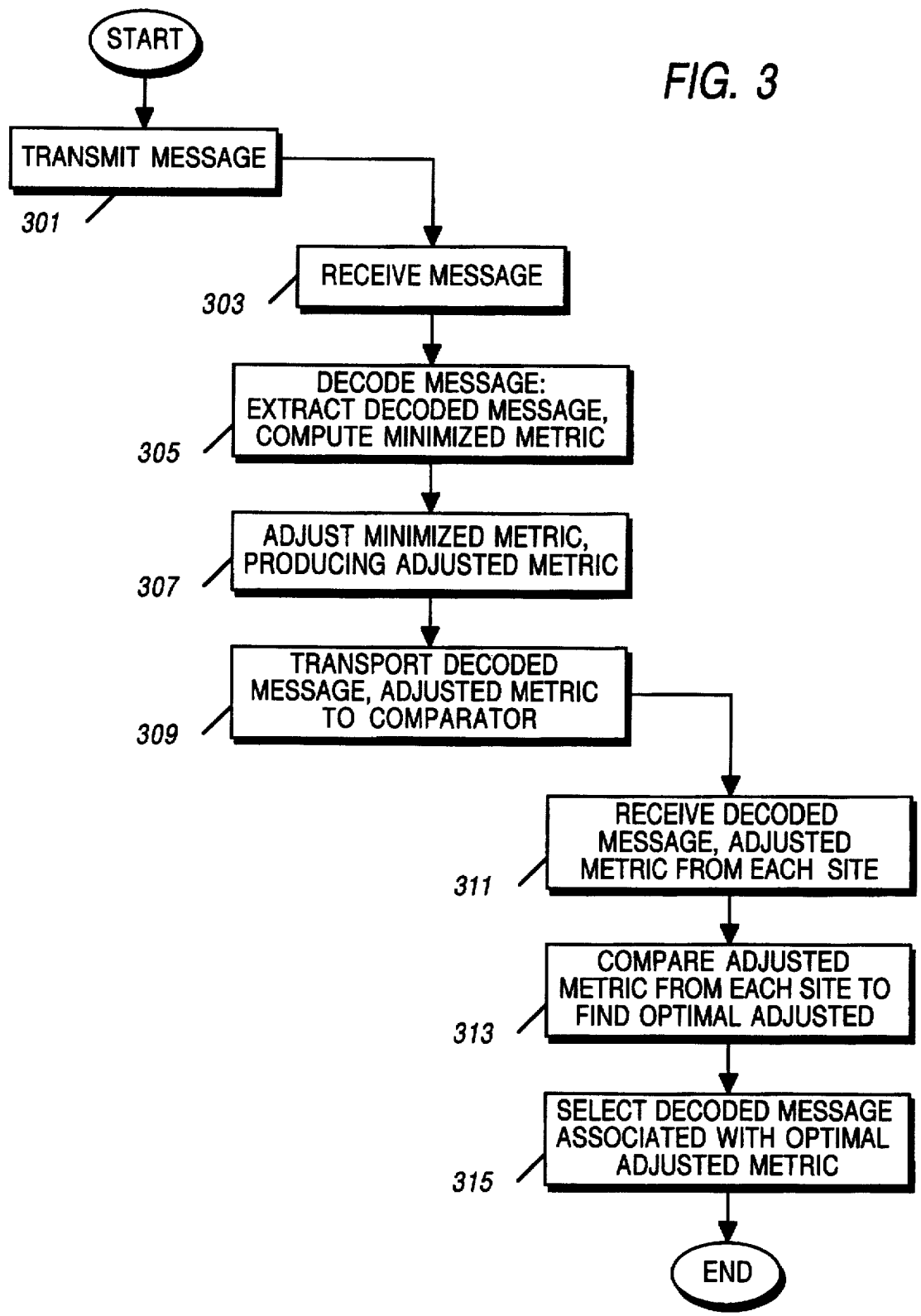
FIG. 3 is a flowchart showing a method of determining and using an adjusted metric in order to vote in a communication system in accordance with the invention.

A method of determining and using an adjusted metric in order to vote in a communication system is shown in FIG. 3. At step 301, a communication unit 111 transmits a message. Steps 303, 305, 307, and 309 are performed at each of the plurality of sites 101, 103, 105, and 107. At step 303, the message transmitted by the communication unit 111 at step 301 is received by each base station receiver 200 tuned to the RF communication resource on which the communication unit 111 transmitted. At step 305, the message is decoded such that a minimized metric is computed and a decoded message containing a decoded message (typically containing raw information) is extracted from the message. In the preferred embodiment, this minimized metric is defined as a result of the Viterbi Algorithm as described with respect to the trellis decoder 203 above. In the preferred embodiment, the decoded message that is extracted from the received message is the digital information that is decoded by applying the Viterbi algorithm to the received message, as is known in the art. At step 307, the minimized metric is adjusted, thereby producing an adjusted metric. The minimized metric indicates the signal quality of the message. The step of adjusting the minimized metric allows the signal quality to be efficiently conveyed to the comparator or voter 109. The minimized metric is adjusted by the method shown in FIG. 4. At step 309, the decoded message and the adjusted metric are transported to the comparator or voter 109.

Steps 311, 313, and 315 are performed by the comparator or voter 109. At step 311, the decoded message and the adjusted metric are received from each of the plurality of sites 101, 103, 105, and 107. At step 313, each of the adjusted metrics from each of the plurality of sites are compared to each other. During this comparison, the voter 109 looks for an adjusted metric that is the optimal adjusted metric. The optimal adjusted metric is determined by doing a comparison of the adjusted metrics associated with each block from the plurality of sites. The adjusted metric with the lowest value is the optimal adjusted metric and the block that is associated with that optimal adjusted metric is the voted block. This process continues for each block in the data message. Beside the method described above, there are many ways in which an optimal adjusted metric may be found from a plurality of adjusted metrics. At step 315, the voter 109 selects the decoded message associated with the optimal adjusted metric as was selected in step 313. This decoded message is then considered to be the voted signal which is then retransmitted or transported to a dispatch center or transmitted to a base station for retransmission throughout the communication system, as previously described.

Figure 4:
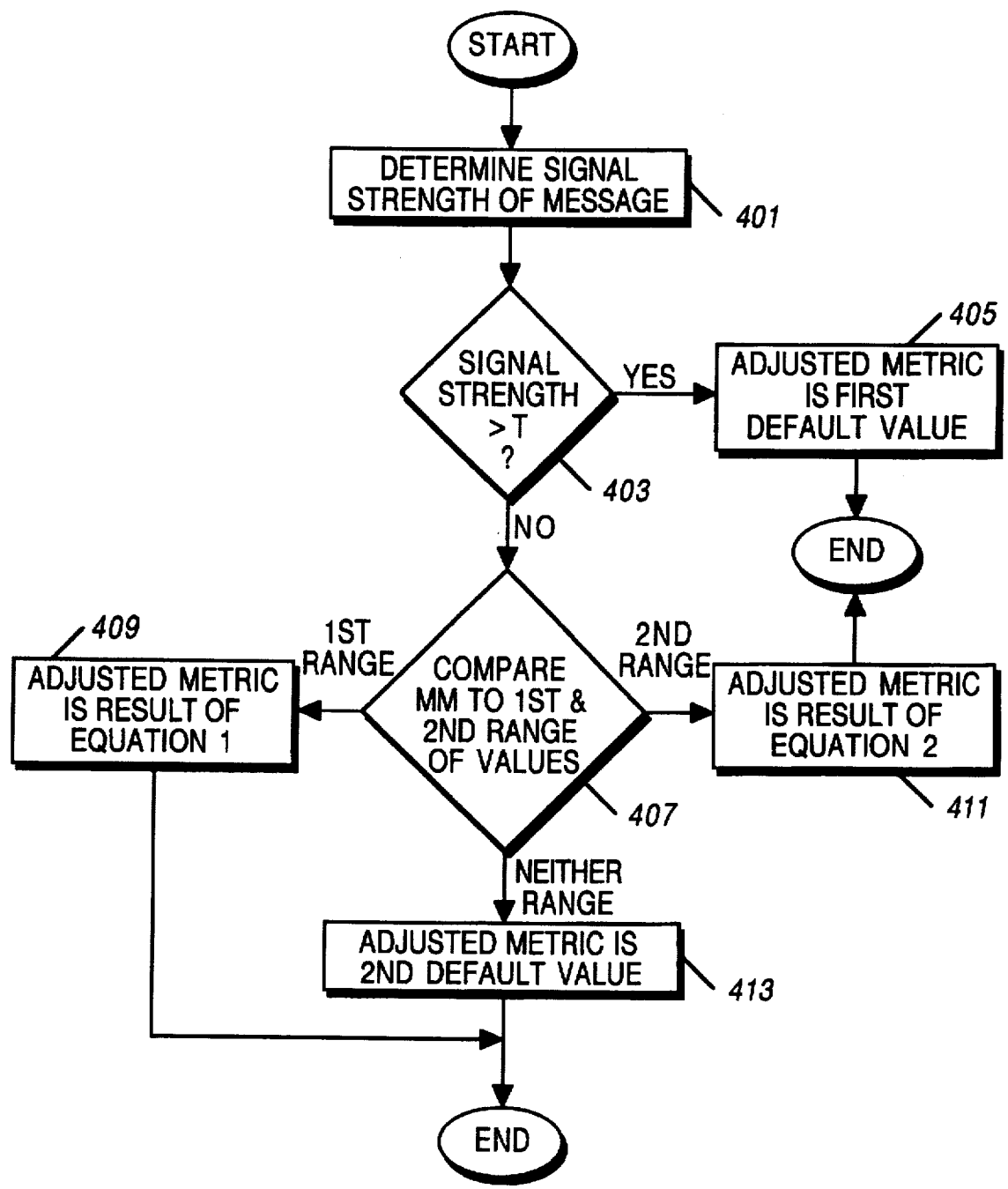
FIG. 4 is a flowchart showing a method of adjusting a minimized metric to produce an adjusted metric in accordance with the invention.

A method of adjusting a minimized metric to produce an adjusted metric is shown in FIG. 4. A signal strength, as is known in the art, is determined for the received message in optional step 401 by the RF receiver 201. When the signal strength is above a threshold at step 403, a first default value is assigned to the adjusted metric at step 405, and the process ends. When the signal strength is below the threshold at step 403, the process continues with step 407, where the minimized metric is quantized. In the preferred embodiment, the threshold value is −90 dBm. The threshold value may vary from system to system; as one of skill in the art would recognize. Steps 401, 403, and 405 are optional steps that are performed if it is desired to compensate for receiver distortion. It is well known in the art that strong signals can cause amplifiers to saturate. Usually the saturation causes some distortion of the signal. The effect of this distortion on the minimized metric gives the minimized metric the appearance that the decoded block is errored when in fact the decoded block has been correctly recovered. Therefore it is sometimes desirable to eliminate the receiver distortion from influencing the minimized metric.

At step 407, the minimized metric (MM) is compared to a first range of values and a second range of values. The first range of values for MM is 0.036 to 0.13. The second range of values for MM is 0.13 to 0.42. The first range of values corresponds to adjusted metric values of 1 to 169. The second range of values corresponds to adjusted metric values of 170 to 254. When the minimized metric falls within the first range of values, the process continues with step 409, where the adjusted metric is the result of the equation:

$$214{,}636(MM)^{3.5} - 0.9, \qquad \text{(equation 1)}$$

and MM is the minimized metric. When the minimized metric falls within the second range of values, the process continues with step 411, where the adjusted metric is the result of the equation:

$$-38.8(\ln(-2.76\,MM+1.26)) + 166, \qquad \text{(equation 2)}$$

and MM is the minimized metric. When the minimized metric falls outside the first and the second range of values, the process continues with step 413 where a second default value is assigned to the adjusted metric. The first default value may be 0. The second default value may be 255. In other methods the first default value (step 405) and the second default value (step 413) may be the same default value. At all times, the adjusted metric is an 8-bit binary value that is a compressed version of a 24-bit binary value that represents the internal number representation for a fractional value in a DSP56002.

In equations 1 and 2, a power function and a natural log function are used to compress the value of the minimized metric into an 8-bit binary field. This compression allows a better dynamic range of values than was previously possible. Compression enables one to group values at one end of the range together into a meaningful quantity and provide distinction from a group of values at another point in the range. In this manner, the adjusted metric is formed by compressing the minimized metric. In addition, the adjusted metric functions to compensate for distortion in the RF receiver 201.

Various types of voting systems are known in the art and the present invention, as described above, may be applied to them as appropriate. In addition, the present invention also encompasses sending the minimized metric to the comparator 109 for use in voting, in which embodiment the step of adjustment is not performed. To select the best quality message from a plurality of messages received at a plurality of sites, the comparator 109 then uses the minimized metric, which is neither compressed nor does it compensate for receiver distortion (i.e., the minimized metric is not adjusted). In essence, the Viterbi algorithm is used to provide a metric that is utilized to vote multiple messages.

Voting systems provide better coverage, as is well established in the art. It is also well established that trellis coded data provides better communications service because digital systems are faster and more flexible than analog systems. By using the soft decision method of the Viterbi Algorithm to recover digital signals, it is well known that sensitivity is enhanced as compared to hard decision methods. By adjusting the Viterbi Algorithm's minimized metric and using the adjusted metric for comparator voting, improvements over what was previously known in the art are gained. Adjusted metrics allow voting to be performed without using the data packet CRC, since a CRC calculation takes a large amount of processing time. This method eliminates the need for this calculation and provides a single one-byte value that can be used for voting. The method also adds more flexibility to the voting process. Instead of waiting for the entire data packet to arrive before voting on the message, voting can be done on a block-by-block basis or a group of blocks or even the entire message if so desired. This method provides for less path delay in the overall message throughput, and if the block by block method of voting is used, a better composite data signal results.

What is claimed is:

1. In a system comprising a comparator and a plurality of sites, a method comprising the steps of:
   at each of a plurality of sites:
   receiving a message;
   decoding the message such that a minimized metric is computed and a decoded message is extracted from the message;
   adjusting the minimized metric, producing an adjusted metric; and
   transporting the decoded message and the adjusted metric to the comparator.

2. The method of claim 1, further comprising the steps of:
   at the comparator:
   receiving the decoded message and the adjusted metric from each of the plurality of sites, thereby receiving a plurality of adjusted metrics;
   comparing the adjusted metric from each of the plurality of sites and finding an optimal adjusted metric from among the plurality of adjusted metrics; and
   selecting the decoded message associated with the optimal adjusted metric.

3. The method of claim 1, wherein the step of adjusting the minimized metric comprises the steps of:
   comparing the minimized metric to a first and a second range of values; and
   when the minimized metric falls within the first range of values, the adjusted metric is a result of $$214,636 \, (MM)^{3.5} - 0.9,$$

where MM is the minimized metric.

4. The method of claim 1, wherein the step of adjusting the minimized metric comprises the steps of:
   comparing the minimized metric to a first and a second range of values; and
   when the minimized metric falls within the second range of values, the adjusted metric is a result of $$-38.8(\ln(-2.76 \, MM + 1.26)) + 166,$$

where MM is the minimized metric.

5. The method of claim 1, wherein the step of adjusting the minimized metric comprises the steps of:
   comparing the minimized metric to a first and a second range of values; and
   when the minimized metric falls outside the first and the second range of values, assigning a default value to the adjusted metric.

6. The method of claim 1, wherein the step of adjusting the minimized metric comprises the steps of:
   determining a signal strength for the message;
   when the signal strength is above a threshold, assigning a first value to the adjusted metric; and
   when the signal strength is below the threshold, quantizing the minimized metric.

7. The method of claim 1, wherein the adjusting step is performed such that the adjusted metric compensates for distortion in the receiving step.

8. The method of claim 1, wherein the adjusting step is performed such that the adjusted metric is formed by compressing the minimized metric.

9. In a system comprising a comparator and a plurality of sites a method comprising the steps of:
   transmitting, by a communication unit, a message;
   at each of a plurality of sites:
   receiving the message;
   decoding the message such that a minimized metric is computed and a decoded message is extracted from the message; and
   transporting the decoded message and the minimized metric to the comparator.

10. The method of claim 9, further comprising the steps of:
    at the comparator:
    receiving the decoded message and the minimized metric from each of the plurality of sites;
    comparing the minimized metric from each of the plurality of sites and finding an optimal minimized metric; and
    selecting the decoded message associated with the optimal minimized metric.

11. The method of claim 9, wherein the minimized metric is produced by the Viterbi algorithm.

12. An apparatus comprising:
    a receiver for receiving a message;
    a trellis decoder, operably coupled to the receiver and constructed and arranged to output decoded information from the message and compute a minimized metric; and
    an adjuster, operably coupled to the trellis decoder and constructed and arranged to provide an adjusted metric from the minimized metric, which adjusted metric compensates for receiver distortion on strong signals and efficiently indicates signal quality of the message.

13. The apparatus of claim 12, further comprising an interface, operably coupled to the adjuster, constructed and arranged to transport the adjusted metric to a comparator.

14. The apparatus of claim 12, wherein the adjuster is constructed and arranged to compress a 24-bit metric into an 8-bit metric.

15. The apparatus of claim 12, wherein the adjuster is constructed and arranged to compare the minimized metric to a first and a second range of values and when the minimized metric falls within the first range of values, the adjusted metric is a result of $$214{,}636\,(MM)^{3.5}-0.9,$$

where MM is the minimized metric.

16. The apparatus of claim 12, wherein the adjuster is constructed and arranged to compare the minimized metric to a first and a second range of values and when the minimized metric falls within the second range of values, the adjusted metric is a result of $$-38.8(\ln(-2.76\,MM+1.26))+166,$$

where MM is the minimized metric.

17. A method comprising the steps of:

A) transmitting, by a communication unit, a message;

B) at each of a plurality of sites:
  receiving the message;
  decoding the message such that a minimized metric is computed and a decoded message is extracted from the message;
  adjusting the minimized metric, producing an adjusted metric;
  transporting the decoded message and the adjusted metric to a comparator;

C) at the comparator:
  receiving the decoded message and the adjusted metric from each of the plurality of sites;
  comparing the adjusted metric from each of the plurality of sites and finding an optimal adjusted metric; and
  selecting the decoded message associated with the optimal adjusted metric.

18. The method of claim 17, wherein the adjusting step is performed such that the adjusted metric compensates for distortion in the receiving step.

19. The method of claim 17, wherein the adjusting step is performed such that the adjusted metric is formed by compressing the minimized metric.

20. A method comprising the steps of:

providing a comparator;

at each of a plurality of sites:
  receiving a message;
  decoding the message such that a minimized metric is computed and a decoded message is extracted from the message;
  adjusting the minimized metric, producing an adjusted metric; and
  transporting the decoded message and the adjusted metric to the comparator.

21. The method of claim 20, further comprising the steps of:

at the comparator:
  receiving the decoded message and the adjusted metric from each of the plurality of sites, thereby receiving a plurality of adjusted metrics;
  comparing the adjusted metric from each of the plurality of sites and finding an optimal adjusted metric from among the plurality of adjusted metrics; and
  selecting the decoded message associated with the optimal adjusted metric.

22. The method of claim 20, wherein the step of adjusting the minimized metric comprises the steps of:

determining a signal strength for the message;

when the signal strength is above a threshold, assigning a first value to the adjusted metric; and when the signal strength is below the threshold, quantizing the minimized metric.

23. The method of claim 20, wherein the adjusting step is performed such that the adjusted metric compensates for distortion in the receiving step.

* * * * *